US012800675B2

(12) United States Patent
Namikawa

(10) Patent No.: US 12,800,675 B2
(45) **Date of Patent: *Nov. 17, 2026**

(54) TRANSFORMER NOISE PERFORMANCE DIAGNOSIS METHOD AND NOISE REDUCTION METHOD

(71) Applicant: JFE STEEL CORPORATION, Tokyo (JP)

(72) Inventor: Misao Namikawa, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 395 days.

This patent is subject to a terminal disclaimer.

(21) Appl. No.: 18/568,486

(22) PCT Filed: May 24, 2022

(86) PCT No.: PCT/JP2022/021303
§ 371 (c)(1),
(2) Date: Dec. 8, 2023

(87) PCT Pub. No.: WO2023/276495
PCT Pub. Date: Jan. 5, 2023

(65) Prior Publication Data

US 2024/0295615 A1 Sep. 5, 2024

(30) Foreign Application Priority Data

Jul. 1, 2021 (JP) ................................ 2021-110269

(51) Int. Cl.
*G01R 31/62* (2020.01)

(52) U.S. Cl.
CPC .................................... *G01R 31/62* (2020.01)

(58) Field of Classification Search
CPC ........ G01R 31/62; G01R 31/50; G01R 31/00; G01H 3/08; G01H 3/04; G01H 3/00;
(Continued)

(56) References Cited

U.S. PATENT DOCUMENTS

2015/0136937 A1* 5/2015 Xu ........................ F16F 15/022 248/566
2019/0255657 A1* 8/2019 Zhao .................... C21D 8/1244
(Continued)

FOREIGN PATENT DOCUMENTS

CA 3117909 A1 5/2020
JP 2006189334 A 7/2006
(Continued)

OTHER PUBLICATIONS

Zhang et al. "Measurement Analysis and Improvement of Vibroacoustic Characteristics of Amorphous Alloy Transformer", Jan. 27, 2022, MDPI, pp. 1-15. (Year: 2022).*
(Continued)

*Primary Examiner* — Mohamed Charioui
(74) *Attorney, Agent, or Firm* — KENJA IP LAW PC

(57) ABSTRACT

A transformer noise performance diagnosis method comprises: acquiring a frequency spectrum of a noise of a stacked iron core included in a transformer, the stacked iron core being formed by stacking electrical steel sheets; for excitation vibration calculation of the stacked iron core, determining transverse elasticity moduli in two planes each including a stacking direction of the stacked iron core; performing the excitation vibration calculation for the stacked iron core using a constitutive equation that includes an elasticity matrix including the determined transverse elasticity moduli as elements and acquiring a frequency spectrum of an excitation vibration of the stacked iron core; calculating a difference between the spectrum of the excitation noise of the stacked iron core and the frequency spectrum of the excitation vibration of the stacked iron core as a difference spectrum; and diagnosing noise performance of the transformer based on the difference spectrum.

9 Claims, 14 Drawing Sheets

(58) Field of Classification Search
CPC .... G01N 29/14; G01N 29/00; G01N 29/4472; G01N 29/44; H01F 27/245; H01F 27/24; H01F 27/00; H01F 30/10; H01F 30/06; H01F 30/00; H01F 27/33
See application file for complete search history.

(56) References Cited

U.S. PATENT DOCUMENTS

| | | | | |
|---|---|---|---|---|
| 2020/0340952 | A1* | 10/2020 | Namikawa | G01N 33/204 |
| 2021/0404992 | A1 | 12/2021 | Namikawa | |

FOREIGN PATENT DOCUMENTS

| | | | |
|---|---|---|---|
| JP | 2013021035 | A | 1/2013 |
| JP | 5527134 | B2 * | 6/2014 |
| JP | 2017106893 | A | 6/2017 |
| JP | 2020170797 | A | 10/2020 |
| WO | 2019146554 | A1 | 8/2019 |
| WO | 2020095527 | A1 | 5/2020 |

OTHER PUBLICATIONS

Aug. 16, 2022, International Search Report issued in the International Patent Application No. PCT/JP2022/021303.
Aug. 21, 2024, the Extended European Search Report issued by the European Patent Office in the corresponding European Patent Application No. 22832653.4.

* cited by examiner

TRANSFORMER NOISE PERFORMANCE DIAGNOSIS METHOD AND NOISE REDUCTION METHOD

TECHNICAL FIELD

The present disclosure relates to a transformer noise performance diagnosis method and noise reduction method.

BACKGROUND

Noise reduction structures for transformers are conventionally known. For example, JP 2013-21035 A (PTL 1) discloses a configuration in which, in a transformer noise reduction structure including a soundproof wall surrounding a transformer body, a resonant sound absorbing structure that resonates with a specific frequency of noise generated when the transformer is in operation is installed on the floor surface within the closed space formed by the outer surface of the transformer and the inner surface of the soundproof wall. JP 2020-170797 A (PTL 2) discloses a configuration in which a weight for noise reduction is attached to part of a reinforcing member attached to the side surface of a transformer tank to make the frequency of noise and the resonance frequency of the reinforcing member different from each other and thus reduce noise.

CITATION LIST

Patent Literature

PTL 1: JP 2013-21035 A
PTL 2: JP 2020-170797 A

SUMMARY

Technical Problem

Transformer noise reduction measures by installing a soundproof wall and a resonant sound absorbing structure as disclosed in PTL 1 increase the transformer cost. Measures by attaching a weight to a reinforcing member as disclosed in PTL 2 are limited in the frequency of noise that can be reduced. Moreover, in the case where a member that is a main source of noise is not identified, a needless cost increase is caused by unnecessarily attaching a weight to a member to which a weight need not be attached. There is thus a need to reduce transformer noise efficiently or at low cost.

It could therefore be helpful to provide a transformer noise performance diagnosis method and noise reduction method that can reduce transformer noise efficiently or at low cost.

Solution to Problem

A transformer noise performance diagnosis method according to an embodiment of the present disclosure comprises: a first step of measuring an excitation noise of a stacked iron core included in a transformer and acquiring a frequency spectrum of the excitation noise, the stacked iron core being formed by stacking electrical steel sheets; a second step of, for excitation vibration calculation for the stacked iron core in the transformer using a constitutive equation that includes an elasticity matrix representing a relationship between stress and strain in the stacked iron core in matrix representation, determining transverse elasticity moduli in two planes each including a stacking direction of the stacked iron core in the transformer, the transverse elasticity moduli being included as elements in the elasticity matrix; a third step of performing the excitation vibration calculation for the stacked iron core in the transformer using the constitutive equation that includes the elasticity matrix including, as the elements, the transverse elasticity moduli determined in the second step and acquiring a frequency spectrum of an excitation vibration of the stacked iron core in the transformer; a fourth step of calculating a difference between the frequency spectrum of the excitation noise of the stacked iron core in the transformer acquired in the first step and the frequency spectrum of the excitation vibration of the stacked iron core in the transformer acquired in the third step, as a difference spectrum; and a fifth step of diagnosing noise performance of the transformer based on the difference spectrum calculated in the fourth step.

A transformer noise reduction method according to an embodiment of the present disclosure comprises a step of, based on a result of diagnosis of the noise performance of the transformer obtained by the above-described transformer noise performance diagnosis method, identifying a part that causes an increase in the noise of the transformer, and generating and notifying a diagnosis result urging to take a noise reduction measure for the identified part.

Advantageous Effect

Thus, a transformer noise performance diagnosis method and noise reduction method according to the present disclosure can reduce transformer noise efficiently or at low cost.

DETAILED DESCRIPTION

Figure 1:
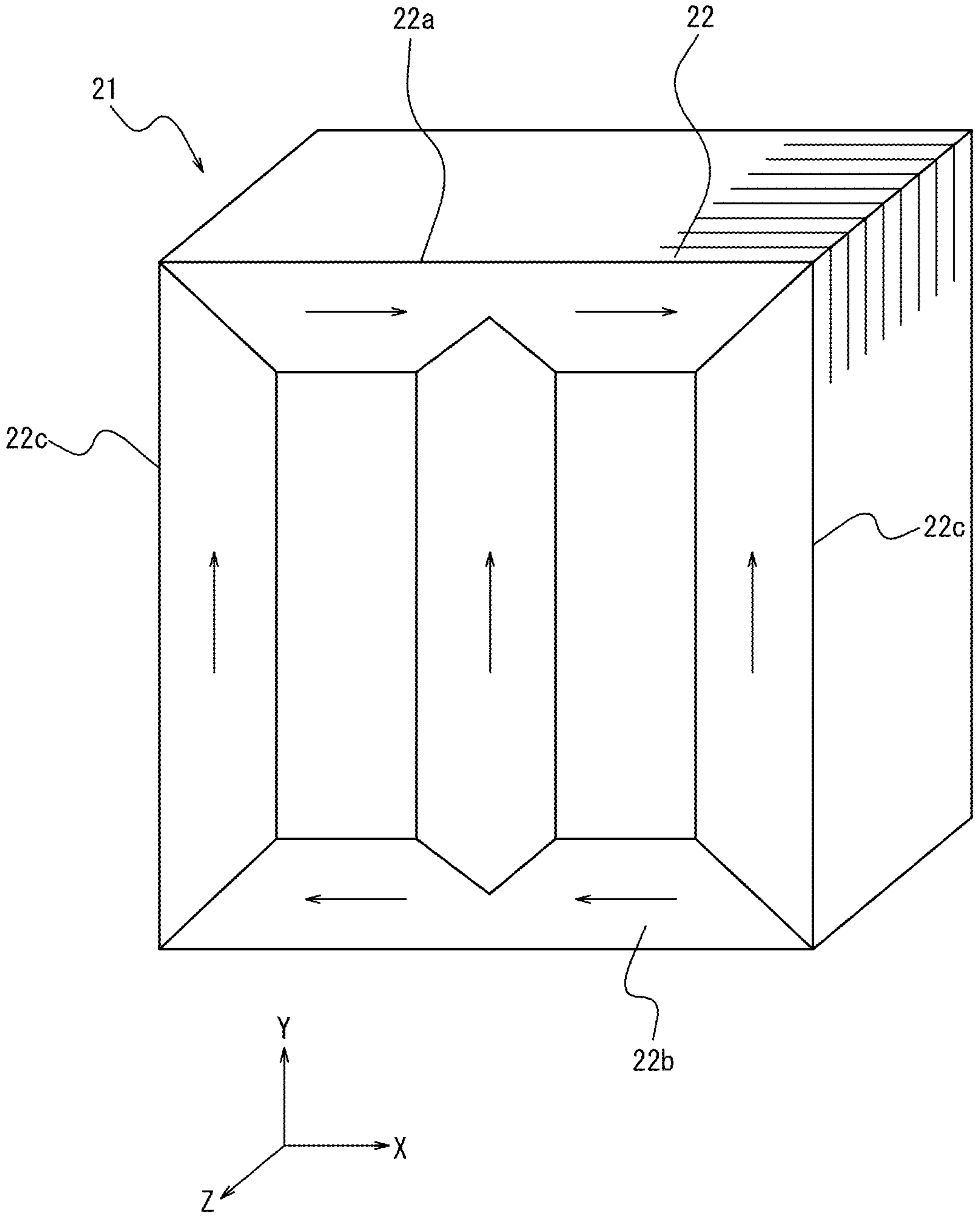
FIG. 1 is a diagram illustrating a configuration example of a stacked iron core in a transformer to be diagnosed by a noise performance diagnosis method according to an embodiment.

A transformer such as a distribution transformer is formed by winding a coil around a stacked iron core obtained by stacking electrical steel sheets. Examples of important performances for a transformer include iron loss (no-load loss) property, excitation current property, and noise property.

Distribution transformers are installed in various locations. In particular, transformers installed in urban areas are strongly required to have low noise. Thus, noise performance, in particular, noise reduction, has become increasingly important as a performance required of transformers in recent years, in view of the influence on the surrounding environments of the transformers installed.

Grain-oriented electrical steel sheets, which are often used as iron core material for transformers, vibrate due to material expansion and shrinkage associated with excitation. Material expansion and shrinkage associated with excitation is also referred to as magnetostriction. Vibration due to magnetostriction is also referred to as magnetostrictive vibration. Magnetostrictive vibration is one of the main causes of noise in transformers. Therefore, the noise performance of a transformer can strongly depend on the magnetostrictive property of the electrical steel sheets used as iron core material. In order to reduce the noise of the transformer, electrical steel sheets having low magnetostrictive property can be employed as the iron core material of the transformer.

However, even in the case where electrical steel sheets having excellent magnetostrictive performance are used as the iron core material, reduction in transformer noise is often insufficient. A possible cause of insufficient noise reduction is the occurrence of a resonance phenomenon in accessory parts other than the iron core, such as the tank or the fixing metal fittings of the iron core of the transformer. It is therefore very important to reduce noise caused by mechanical vibrations of accessory parts other than the transformer iron core when designing and producing transformers.

Various techniques may be available for reducing the excitation noise of a transformer. One example is a method that installs a soundproof wall made of iron sheets or concrete around the transformer body. This method may reduce noise by the sound insulation effect of the soundproof wall, but the noise reduction is likely to be insufficient due to resonance within the soundproof wall. Such noise caused by resonance within the soundproof wall may be reduced by installing a resonant sound absorbing structure within the soundproof wall as disclosed in the foregoing PTL 1 (JP 2013-21035 A). However, installing not only the soundproof wall but also the resonant sound absorbing structure further increases the cost of the transformer.

Transformer noise may be reduced without installing a soundproof wall, by attaching a reinforcing member to the side of the tank of the transformer and attaching a weight to part of the reinforcing member as disclosed in the foregoing PTL 2 (JP 2020-170797 A). However, such a measure by attaching a weight is limited in the frequency of noise that can be reduced. For example, the frequency of noise reduced is limited to twice the excitation frequency in PTL 2. Moreover, in the case where the noise generated by the reinforcing member to which the weight is attached is not the main noise source of the transformer noise, the noise reduction effect by attaching the weight is negligible. If the noise reduction effect is negligible, attaching the weight is needless and simply causes an increase in cost.

As a transformer noise performance diagnosis method according to this embodiment, a method that can easily identify a main noise source of transformer noise will be described below. Moreover, as a transformer noise reduction method according to this embodiment, a method that can take measures for the noise source identified by the noise performance diagnosis method efficiently or at low cost will be described below.

An embodiment of a transformer noise performance diagnosis method and noise reduction method according to the present disclosure will be described below with reference to the drawings. The drawings are schematic and may be different from actual ones. The following embodiment is illustrative of a device or method for embodying the technical idea of the present disclosure, but is not intended to limit the configuration to those described below. That is, various modifications can be made to the technical idea of the present disclosure within the technical scope defined by the claims.

Embodiment

A stacked iron core 21 to be analyzed in this embodiment is assumed here to be a stacked iron core for a three-phase tripod transformer used as a distribution transformer, for example. As illustrated in FIG. 1, the stacked iron core 21 may be formed by stacking a plurality of grain-oriented electrical steel sheets 22 that each include three legs **22*c* connected between an upper yoke 22*a* and a lower yoke 22*b* and have a predetermined thickness. The stacked grain-oriented electrical steel sheets 22 are fixed by wrapping glass tape around them. The stacked iron core 21 to be analyzed in this embodiment is not limited to the stacked iron core for a three-phase tripod transformer illustrated in FIG. 1**.

Figure 2:
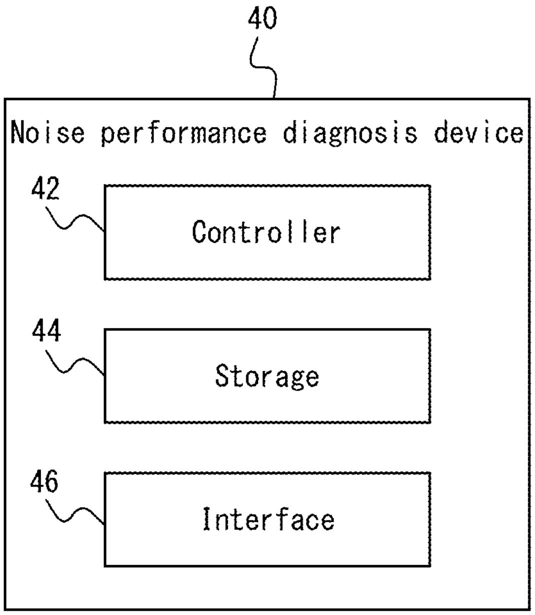
FIG. 2 is a block diagram illustrating a configuration example of a noise performance diagnosis device according to an embodiment.

Each step of the transformer noise performance diagnosis method according to this embodiment may be executed by a noise performance diagnosis device 40 illustrated in FIG. 2. The noise performance diagnosis device 40 includes a controller 42, a storage 44, and an interface 46.

The controller 42 controls and manages each functional unit included in the noise performance diagnosis device 40, and the entire noise performance diagnosis device 40. The controller 42 may include at least one processor such as a central processing unit (CPU), in order to control and manage various functions. The controller 42 may be composed of one processor or a plurality of processors. The processor included in the controller 42 may achieve the functions of the noise performance diagnosis device 40 by reading and executing a program stored in the storage 44.

The storage 44 may have a function as memory that stores various information. The storage 44 may store, for example, the program executed by the controller 42, data used in the processes executed by the controller 42, the results of the processes, etc. The storage 44 may function as work memory for the controller 42. The storage 44 may be implemented by, for example, semiconductor memory or the like, but is not limited to such and may include any storage device. For example, the storage 44 may be implemented as internal memory of the processor used as the controller 42, or implemented as a hard disk drive (HDD) accessible from the controller 42.

The interface 46 may include a communication interface for communicating with other devices by wire or wirelessly. The interface 46 may include an input-output port for inputting and outputting data from and to other devices. The interface 46 transmits and receives necessary data and signals to and from a process computer or host system. The interface 46 may communicate based on a wired communication standard or a wireless communication standard. Examples of the wireless communication standard include cellular phone communication standards such as 3G, 4G, and 5G. Other examples of the wireless communication standard include IEEE 802.11 and Bluetooth® (Bluetooth is a registered trademark in Japan, other countries, or both). The interface 46 may support one or more of these communication standards. The interface 46 is not limited to these examples, and may communicate with other devices or input/output data based on any of various standards.

Figure 3:
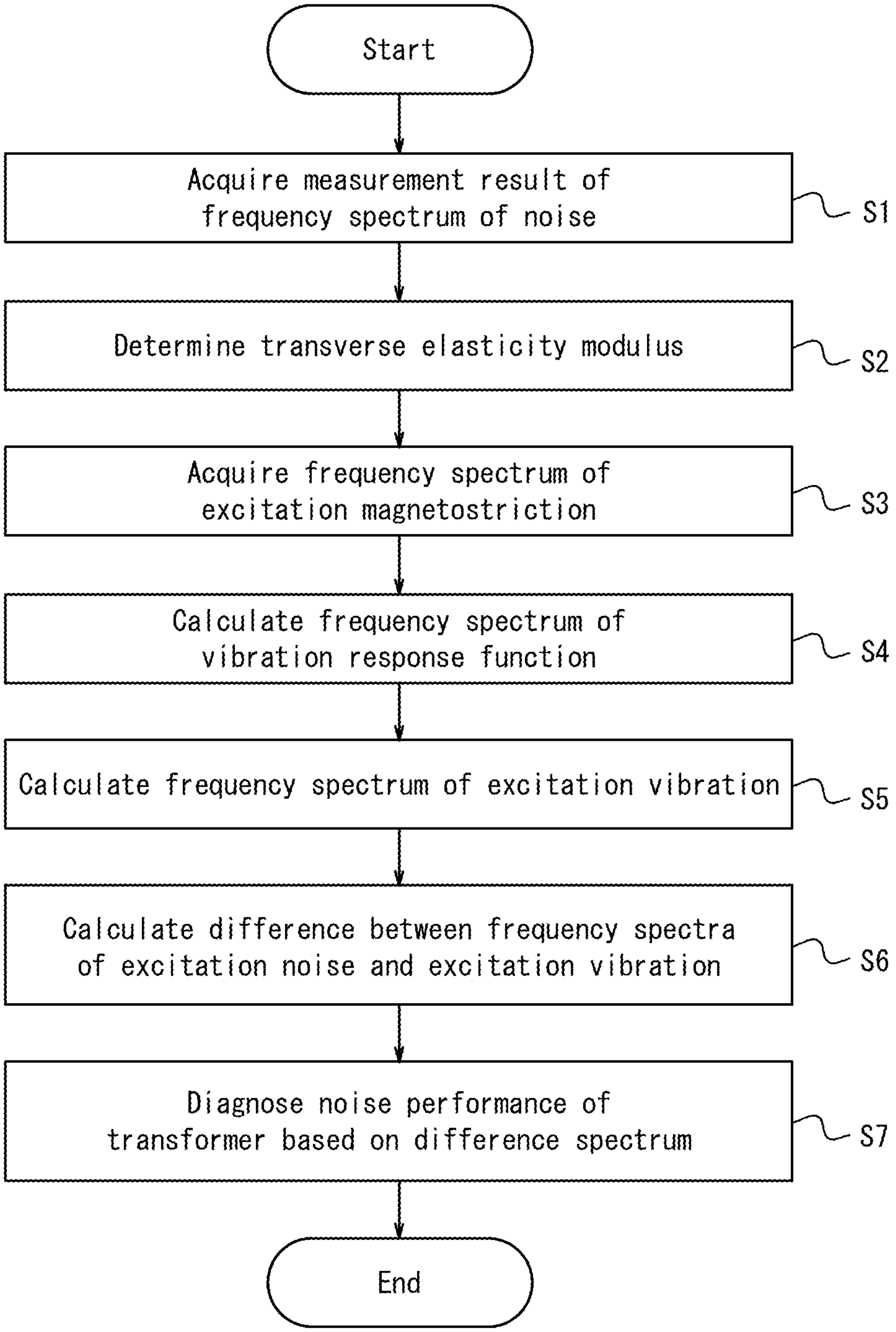
FIG. 3 is a flowchart illustrating a procedure example of a determination method according to an embodiment.

The noise performance diagnosis method according to this embodiment will be described below, assuming that each step of the flowchart illustrated in FIG. 3 is executed by the controller 42 in the noise performance diagnosis device 40. Each step of the noise performance diagnosis method may be performed by another device or by a human.

First, in step S1 (first step), the controller 42 acquires the measurement result of the frequency spectrum of noise obtained by measuring the excitation noise of the stacked iron core 21 in the transformer subjected to vibration analysis illustrated in FIG. 1. Specifically, the excitation frequency of the stacked iron core 21 is set to 50 Hz and the excitation noise is measured. Typically, the frequency spectrum of the excitation noise of a transformer is composed of frequency components that are integral multiples of twice the excitation frequency (i.e. even multiples of the excitation frequency). Hence, the spectrum of the excitation noise at each frequency of 100 Hz pitch in the range from 100 Hz to 1000 Hz is acquired as the frequency spectrum of the noise. At transformer production sites, the excitation noise properties of transformers are commonly measured as a quality control item for shipped products. There is thus no particular difficulty in the measurement. The excitation frequency may be set to 60 Hz. In the case where the excitation frequency is set to 60 Hz, the spectrum of the excitation noise at each frequency of 120 Hz pitch from 120 Hz to 1200 Hz is acquired.

Figure 4:
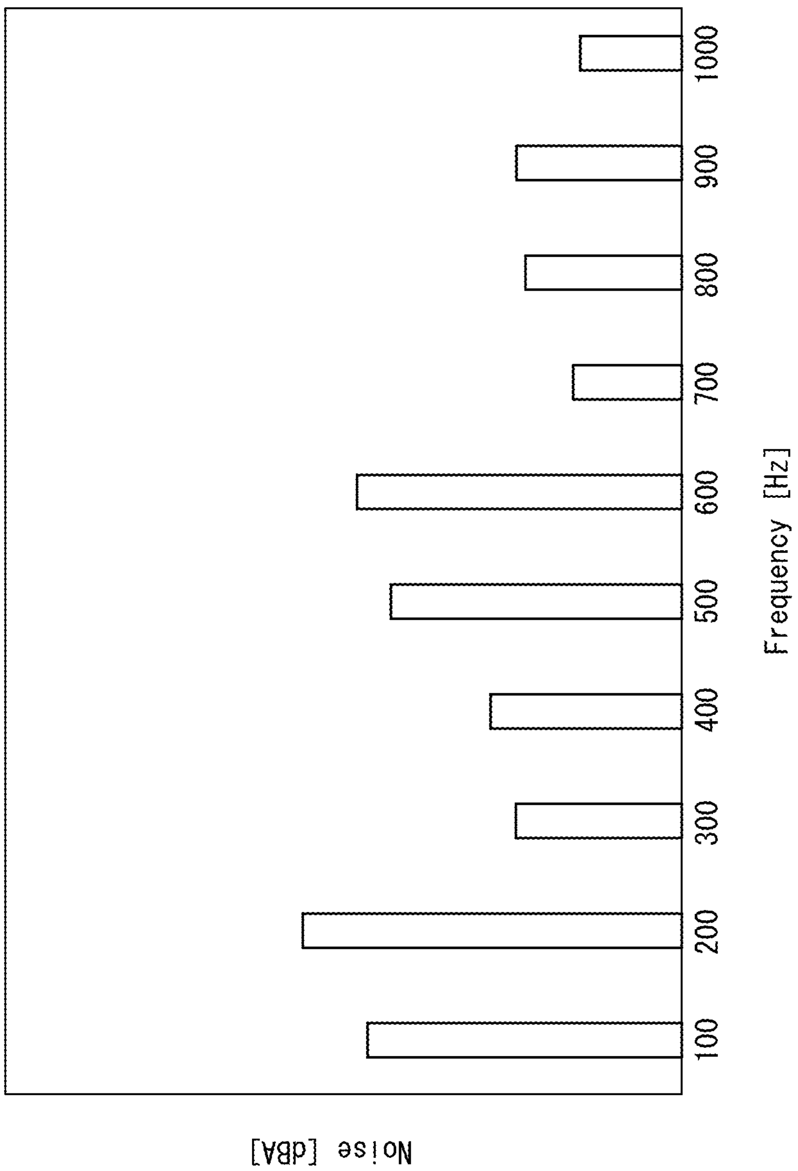
FIG. 4 is a graph illustrating an example of a frequency spectrum of noise of a transformer.

An example in which the excitation frequency is set to 50 Hz will be described below. FIG. 4 is a graph illustrating an example of the frequency spectrum of noise acquired in the case where the excitation frequency is set to 50 Hz. In the graph of FIG. 4, the horizontal axis represents the frequency and the vertical axis represents the magnitude of excitation noise.

Next, in step S2 (second step), the controller 42 determines transverse elasticity moduli included as elements in an elasticity matrix, in order to perform excitation vibration calculation for the stacked iron core 21 and acquire the frequency spectrum of the excitation vibration in step S4 described later. The excitation vibration calculation for the stacked iron core 21 is possible through accurate estimation of the mechanical property values of the stacked iron core 21 formed by stacking a large number of thin steel sheets. The mechanical property values of the stacked iron core 21 can be accurately estimated based on, for example, the technique disclosed in JP 6729837 B1. The excitation vibration calculation for the stacked iron core 21 in this embodiment is performed using the technique disclosed in JP 6729837 B1 in principle.

In this embodiment, a constitutive equation indicating the relationship between stress and strain is used as a governing equation for elastic structural analysis, in order to numerically analyze the vibration of the stacked iron core 21 of the three-phase tripod transformer illustrated in FIG. 1. The constitutive equation is represented as the following equation (1) by replacing the laminate (stacked product) with an equivalent homogeneous body and expressing the influence of stacking using matrix physical property:

$$[\sigma]=[C][\varepsilon] \tag{1}$$

where $[\sigma]$ is a stress matrix, $[C]$ is an elasticity matrix (stiffness matrix) as a response function, and $[\varepsilon]$ is a strain matrix.

As illustrated in FIG. 1, the directions of the stacked iron core 21 are expressed using the X-axis, Y-axis, and Z-axis of the XYZ orthogonal coordinate system. The grain-oriented electrical steel sheets 22 extend along the XY plane, and are stacked in the Z-axis direction.

Figure 5A:
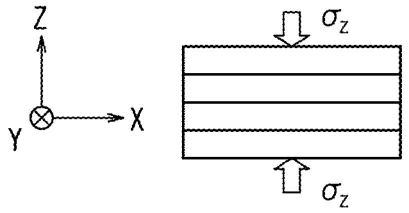
FIG. 5A is a diagram explaining normal stress in the stacking direction (Z-axis direction) acting on the stacked iron core.
Figure 5B:
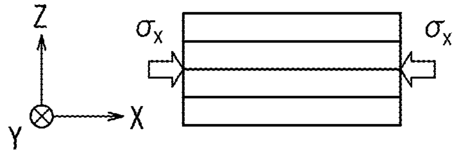
FIG. 5B is a diagram explaining normal stress in a direction (X-axis direction) orthogonal to the stacking direction acting on the stacked iron core.
Figure 5C:
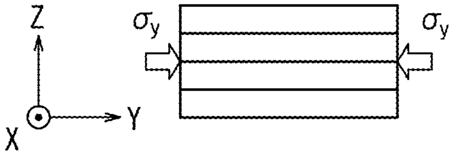
FIG. 5C is a diagram explaining normal stress in a direction (Y-axis direction) orthogonal to the stacking direction acting on the stacked iron core.
Figure 5D:
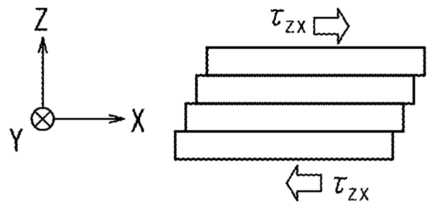
FIG. 5D is a diagram explaining shear stress in the ZX plane acting on the stacked iron core.
Figure 5E:
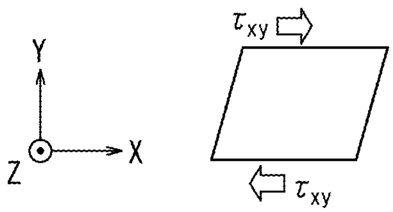
FIG. 5E is a diagram explaining shear stress in the XY plane acting on the stacked iron core.
Figure 5F:
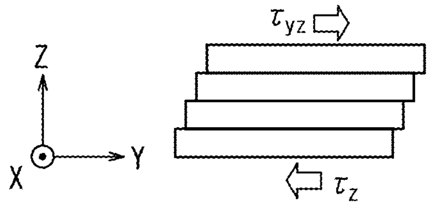
FIG. 5F is a diagram explaining shear stress in the YZ plane acting on the stacked iron core.

The stress acting on the stacked iron core 21 includes a normal component acting in a direction (compression direction or tensile direction) perpendicular to the stacked iron core 21 and a shear component acting in the shear direction of the stacked iron core 21. FIGS. 5A, 5B, and 5C illustrate normal stresses acting in the Z-axis direction, the X-axis direction, and the Y-axis direction, respectively. The normal stresses acting in the Z-axis direction, the X-axis direction, and the Y-axis direction are denoted by $\sigma z$, $\sigma x$, and $\sigma y$, respectively. FIGS. 5D, 5E, and 5F illustrate shear stresses acting in the ZX plane, the XY plane, and the YZ plane, respectively. The shear stresses acting in the ZX plane, the XY plane, and the YZ plane are denoted by $\tau zx$, $\tau xy$, and $\tau yz$, respectively. The stress matrix $[\sigma]$ has normal stress and shear stress as components.

The strain of the stacked iron core 21 includes a component that deforms the stacked iron core 21 in the perpendicular direction (compression direction or tensile direction) and a component that deforms the stacked iron core 21 in the shear direction. The normal strains in the Z-axis direction, the X-axis direction, and the Y-axis direction are denoted by $\varepsilon z$, $\varepsilon x$, and $\varepsilon y$, respectively. The shear strains in the ZX plane, the XY plane, and the YZ plane are denoted by $\gamma zx$, $\gamma xy$, and $\gamma yz$, respectively.

The elasticity matrix [C] has 6×6=36 elements that specify the relationship between the six components of stress and the six components of strain. The 36 elements are represented by elasticity moduli Cij (i=1 to 6, j=1 to 6). The relationship between stress and strain is represented by the elasticity matrix as shown in the following equation (2):

[Math. 1]

$$\begin{bmatrix}\sigma_x\\ \sigma_y\\ \sigma_z\\ \tau_{yz}\\ \tau_{zx}\\ \tau_{xy}\end{bmatrix}=\begin{bmatrix}C_{11}&C_{12}&C_{13}&C_{14}&C_{15}&C_{16}\\ C_{12}&C_{22}&C_{23}&C_{24}&C_{25}&C_{26}\\ C_{13}&C_{23}&C_{33}&C_{34}&C_{35}&C_{36}\\ C_{14}&C_{24}&C_{34}&C_{44}&C_{45}&C_{46}\\ C_{15}&C_{25}&C_{35}&C_{45}&C_{55}&C_{56}\\ C_{16}&C_{26}&C_{36}&C_{46}&C_{56}&C_{66}\end{bmatrix}\begin{bmatrix}\varepsilon_x\\ \varepsilon_y\\ \varepsilon_z\\ \gamma_{yz}\\ \gamma_{zx}\\ \gamma_{xy}\end{bmatrix}. \tag{2}$$

Since the stacked iron core 21 is made by stacking the grain-oriented electrical steel sheets 22, the stacked iron core 21 has mechanical symmetry and also has 180-degree symmetry in the longitudinal direction of the stacked grain-oriented electrical steel sheets 22 and in a direction orthogonal to the longitudinal direction. Hence, the stacked iron core 21 can be regarded as having orthotropy as an anisotropy classification. The elasticity matrix of an orthotropic object basically has a total of nine elasticity moduli, C11, C12, C13, C22, C23, C33, C44, C55, and C66, as shown in the following equation (3):

[Math. 2]

$$\begin{bmatrix}\sigma_x\\ \sigma_y\\ \sigma_z\\ \tau_{yz}\\ \tau_{zx}\\ \tau_{xy}\end{bmatrix}=\begin{bmatrix}C_{11}&C_{12}&C_{13}&0&0&0\\ C_{12}&C_{22}&C_{23}&0&0&0\\ C_{13}&C_{23}&C_{33}&0&0&0\\ 0&0&0&C_{44}&0&0\\ 0&0&0&0&C_{55}&0\\ 0&0&0&0&0&C_{66}\end{bmatrix}\begin{bmatrix}\varepsilon_x\\ \varepsilon_y\\ \varepsilon_z\\ \gamma_{yz}\\ \gamma_{zx}\\ \gamma_{xy}\end{bmatrix}. \quad (3)$$

Of these nine elasticity moduli, the elasticity moduli C11, C12, C13, C22, C23, and C33 are calculated based on the longitudinal elasticity moduli Ex, Ey, and Ez and the Poisson's ratios νxy, νyx, νyz, νzy, νzx, and νxz according to the following equations (4) to (10):

[Math. 3]

$$C_{11}=\frac{1-\nu_{yz}\nu_{zy}}{E_yE_z\Delta} \quad (4)$$

$$C_{12}=\frac{\nu_{yx}+\nu_{zx}\nu_{yz}}{E_yE_z\Delta} \quad (5)$$

$$C_{13}=\frac{\nu_{zx}+\nu_{yx}\nu_{zy}}{E_yE_z\Delta} \quad (6)$$

$$C_{22}=\frac{1-\nu_{xz}\nu_{zx}}{E_zE_x\Delta} \quad (7)$$

$$C_{23}=\frac{\nu_{zy}+\nu_{xy}\nu_{zx}}{E_xE_y\Delta} \quad (8)$$

$$C_{33}=\frac{1-\nu_{xy}\nu_{yx}}{E_xE_y\Delta} \quad (9)$$

$$\Delta=\frac{1-\nu_{xy}\nu_{yx}-\nu_{xz}\nu_{zx}-\nu_{xy}\nu_{yz}-2\nu_{yx}\nu_{zy}\nu_{zx}}{E_xE_yE_z}. \quad (10)$$

Moreover, the elasticity modulus C44 corresponds to the transverse elasticity modulus Gyz in the YZ plane, the elasticity modulus C55 corresponds to the transverse elasticity modulus Gzx in the ZX plane, and the elasticity modulus C66 corresponds to the transverse elasticity modulus Gxy in the XY plane, as shown in the following equations (11), (12), and (13):

[Math. 4]

$$C_{44}=G_{yz} \quad (11)$$

$$C_{55}=G_{zx} \quad (12)$$

$$C_{66}=G_{xy}. \quad (13)$$

Here, Ex, Ey, and Ez denote the longitudinal elasticity modulus (Young's modulus) in the X direction, the longitudinal elasticity modulus (Young's modulus) in the Y direction, and the longitudinal elasticity modulus (Young's modulus) in the Z direction respectively, and νxy, νyx, νyz, νzy, νzx, and νxz denote the Poisson's ratio in the XY plane (the ratio of the longitudinal strain in the X direction and the transverse strain in the Y direction), the Poisson's ratio in the YX plane, the Poisson's ratio in the YZ plane, the Poisson's ratio in the ZY plane, the Poisson's ratio in the ZX plane, and the Poisson's ratio in the XZ plane respectively. The relationship represented by the following equation (14), called the reciprocity theorem, holds between the longitudinal elasticity moduli and the Poisson's ratios:

[Math. 5]

$$\frac{\nu_{xy}}{E_x}=\frac{\nu_{yx}}{E_y},\ \frac{\nu_{yz}}{E_y}=\frac{\nu_{zy}}{E_z},\ \frac{\nu_{zx}}{E_z}=\frac{\nu_{xz}}{E_x}. \quad (14)$$

According to the reciprocity theorem, the Poisson's ratio νyx in the YX plane is expressed using Ex, Ey, and νxy, the Poisson's ratio νzy in the ZY plane is expressed using Ez, Ey, and νyz, and the Poisson's ratio νxz in the XZ plane is expressed using Ez, Ex, and νzx.

Thus, the values of the total of nine elasticity moduli C11, C12, C13, C22, C23, C33, C44, C55, and C66 representing the elasticity matrix of an orthotropic object are expressed using the total of nine mechanical property values: the longitudinal elasticity moduli Ex, Ey, and Ez, the transverse elasticity moduli Gyz, Gzx, and Gxy, and the Poisson's ratios νxy, νyz, and νzx. Therefore, determining these nine mechanical property values is equivalent to determining the nine elasticity moduli representing the elasticity matrix. A method of determining the longitudinal elasticity moduli, the transverse elasticity moduli, and the Poisson's ratios will be described below.

Regarding the longitudinal elasticity moduli of the stacked iron core 21 having orthotropy, the longitudinal elasticity moduli Ex and Ey can be set to values equal to the longitudinal elasticity moduli Ex0 and Ey0 of one steel sheet, respectively. On the other hand, the longitudinal elasticity modulus Ez cannot be set to a value equal to the longitudinal elasticity modulus Ez0 of one steel sheet. This is because there is a slight gap between the stacked steel sheets. In view of this, in this embodiment, an experiment is conducted to determine the relationship between the load and displacement in the stacking direction of the stacked steel sheets, and the longitudinal elasticity modulus Ez is set based on the result of the experiment. In this embodiment, it is assumed that Ez is set to 10 GPa based on the result of the experiment. Here, given that the magnitude of the value of the longitudinal elasticity modulus in the stacking direction has little influence on the vibration calculation result, the error in the vibration calculation result is small even if Ez is set to a value equal to the longitudinal elasticity modulus Ez0 of one steel sheet.

Regarding the Poisson's ratios of the stacked iron core 21 having orthotropy, the Poisson's ratio νxy in the XY plane can be set to a value equal to the Poisson's ratio νxy0 of one steel sheet. On the other hand, the Poisson's ratio νyz in the YZ plane and the Poisson's ratio νzx in the ZX plane cannot be set directly to the Poisson's ratios νyz0 and νzx0 of one steel sheet. This is because the dynamic linkage between the strain in the stacking direction and the strain in the direction perpendicular to the stacking direction is likely to be very weak in the stacked iron core 21. It is extremely difficult to actually measure νyz and νzx. However, given the above consideration, νyz and νzx are expected to be very small. Hence, it is assumed in this embodiment that νyz and νzx are both zero.

Regarding the transverse elasticity moduli of the stacked iron core 21, the transverse elasticity modulus Gxy in the XY plane can be set to a value equal to the transverse elasticity modulus Gxy0 of one steel sheet. On the other hand, the transverse elasticity moduli in two planes each including the stacking direction, namely, the transverse elasticity modulus Gzx in the ZX plane and the transverse elasticity modulus Gyz in the YZ plane, cannot be set directly to the transverse elasticity moduli Gxz0 and Gyz0 of one steel sheet. This is because the influence of slippage between the steel sheets in the X direction and the Y direction orthogonal to the stacking direction, which occurs at the interface of the stacked steel sheets, needs to be reflected on the transverse elasticity moduli Gzx and Gyz. Therefore, in order to perform vibration analysis using the constitutive equation that represents the relationship between the stress and strain of the stacked iron core 21 in matrix representation, it is important to determine the transverse elasticity moduli in the two planes each including the stacking direction of the stacked iron core 21 in the transformer included in the elasticity matrix in the constitutive equation, namely, the transverse elasticity modulus Gzx in the ZX plane and the transverse elasticity modulus Gyz in the YZ plane.

In view of this, in this embodiment, the transverse elasticity moduli Gzx and Gyz in the two planes each including the stacking direction are determined based on the method disclosed in JP 6729837 B1 for the value of the clamping pressure in the stacking direction when producing the stacked iron core 21.

Figure 6:
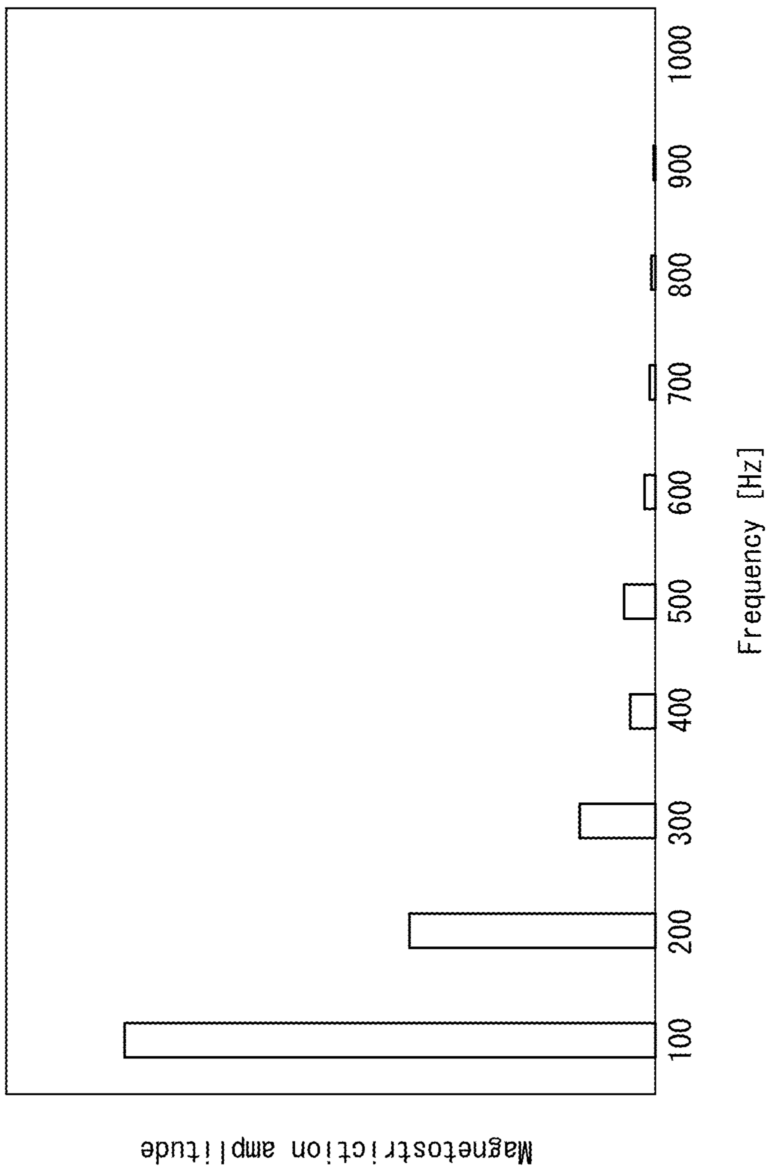
FIG. 6 is a graph illustrating an example of frequency spectrum data of excitation magnetostriction of an electrical steel sheet forming the stacked iron core in the transformer.

Next, in step S3, the controller 42 acquires frequency spectrum data of excitation magnetostriction used in the excitation vibration calculation for the stacked iron core 21 in the transformer in step S4 described later. The controller 42 acquires frequency spectrum data of excitation magnetostriction of the same electrical steel sheet as the grain-oriented electrical steel sheets 22 forming the stacked iron core 21 in the transformer subjected to vibration analysis illustrated in FIG. 1. The controller 42 acquires, as the frequency spectrum data of excitation magnetostriction, spectrum data of excitation magnetostriction amplitude at each frequency of 100 Hz pitch in the range from 100 Hz to 1000 Hz. The controller 42 can acquire the frequency spectrum data of excitation magnetostriction, for example, by measuring the excitation magnetostriction of the electrical steel sheet or acquiring the frequency spectrum data from the manufacturer of the electrical steel sheet. FIG. 6 is a graph illustrating an example of the acquired frequency spectrum data of excitation magnetostriction. In the graph of FIG. 6, the horizontal axis represents the frequency and the vertical axis represents the magnitude of magnetostriction amplitude. The magnitude of magnetostriction amplitude at each frequency is expressed in dB as a value normalized by being divided by the value of magnetostriction amplitude when the frequency is 100 Hz. The dB expression corresponds to a value obtained by multiplying, by 10, the common logarithm of the value to be expressed.

Next, in step S4, the controller 42 performs numerical calculation of the excitation vibration of the stacked iron core 21 in the transformer subjected to vibration analysis illustrated in FIG. 1, and calculates the frequency spectrum of the vibration response function of the stacked iron core 21.

Specifically, the controller 42 performs vibration response analysis on the stacked iron core 21 in the transformer subjected to vibration analysis, using structural analysis software. Of the total of nine mechanical property values of the stacked iron core 21, i.e. the longitudinal elasticity moduli Ex, Ey, and Ez, the transverse elasticity moduli Gyz, Gzx, and Gxy, and the Poisson's ratios νxy, νyz, and νzx, the seven mechanical property values excluding the transverse elasticity moduli Gyz and Gzx are set as follows, as described above:

$$Ex = Ex0,\ Ey = Ey0,\ Ez = 10\ GPa$$

$$Gxy = Gxy0$$

$$\nu xy = \nu xy0,\ \nu yz = \nu zx = 0.$$

Figure 7:
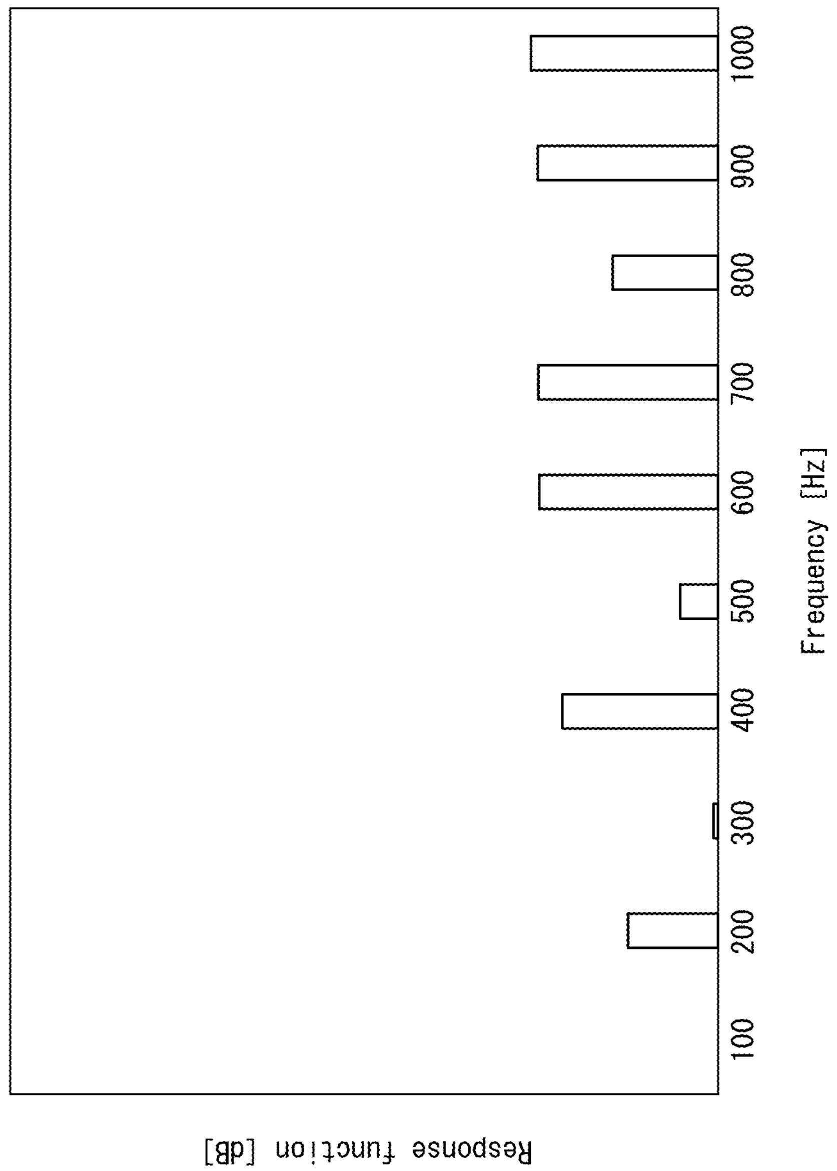
FIG. 7 is a graph illustrating an example of a frequency spectrum of a vibration response function of the stacked iron core in the transformer.

The controller 42 then determines the remaining two transverse elasticity moduli Gyz and Gzx in the two planes each including the stacking direction, based on the method disclosed in JP 6729837 B1 for the value of the clamping pressure in the stacking direction when producing the iron core as mentioned above. The controller 42 performs vibration calculation using the transverse elasticity moduli Gzx and Gyz in the two planes each including the stacking direction, to calculate the frequency spectrum of the vibration response function of the stacked iron core 21 in the transformer. FIG. 7 is a graph illustrating an example of the frequency spectrum of the vibration response function of the stacked iron core 21 in the transformer calculated in step S4. In the graph of FIG. 7, the horizontal axis represents the frequency and the vertical axis represents the magnitude of the response function. The magnitude of the response function is represented as a value normalized so that the vibration response value when the frequency is 100 Hz will be 0 dB.

Next, in step S5, the controller 42 calculates the frequency spectrum of the excitation vibration of the stacked iron core 21 in the transformer based on the frequency spectrum data of the excitation magnetostriction of the electrical steel sheet acquired in step S3 and the frequency spectrum of the vibration response function of the stacked iron core 21 in the transformer calculated in step S4. Specifically, the controller 42 calculates the frequency spectrum of the excitation vibration of the stacked iron core 21 in the transformer as the product of the frequency spectrum data of the excitation magnetostriction of the electrical steel sheet and the frequency spectrum of the vibration response function of the stacked iron core 21 in the transformer. In the case where the frequency spectrum is expressed in dB, the controller 42 calculates the frequency spectrum of the excitation vibration of the stacked iron core 21 in the transformer as the sum of the frequency spectrum of the excitation magnetostriction of the electrical steel sheet and the frequency spectrum of the vibration response function of the stacked iron core 21 in the transformer.

Figure 8:
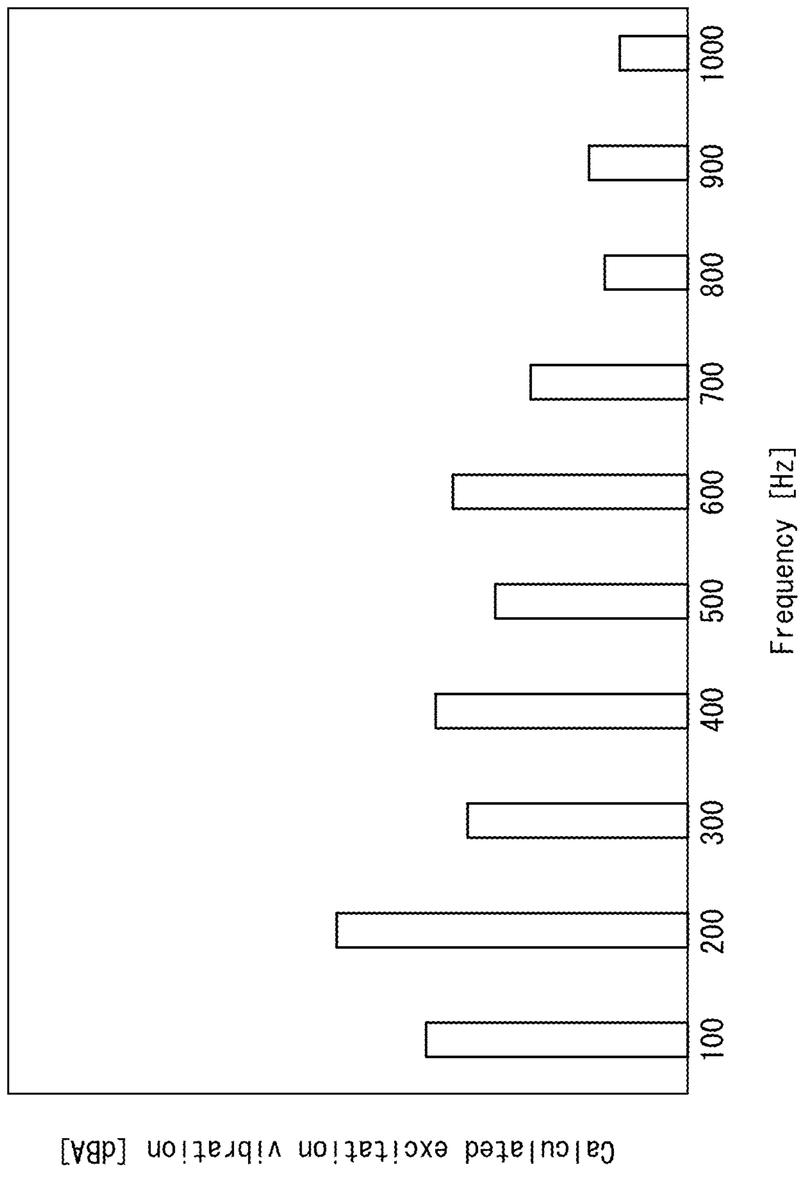
FIG. 8 is a graph illustrating an example of a frequency spectrum of excitation vibration of the stacked iron core in the transformer.

FIG. 8 is a graph illustrating an example of the calculated frequency spectrum of the excitation vibration of the stacked iron core 21 in the transformer. In the graph of FIG. 8, the horizontal axis represents the frequency and the vertical axis represents the calculated value of the magnitude of the excitation vibration. The magnitude of the excitation vibration is expressed in dB.

In the noise performance diagnosis method according to this embodiment, steps S3 to S5 in FIG. 3 constitute a third step to calculate the excitation vibration of the stacked iron core 21 in the transformer subjected to vibration analysis illustrated in FIG. 1 and acquire the frequency spectrum of the excitation vibration.

Figure 9:
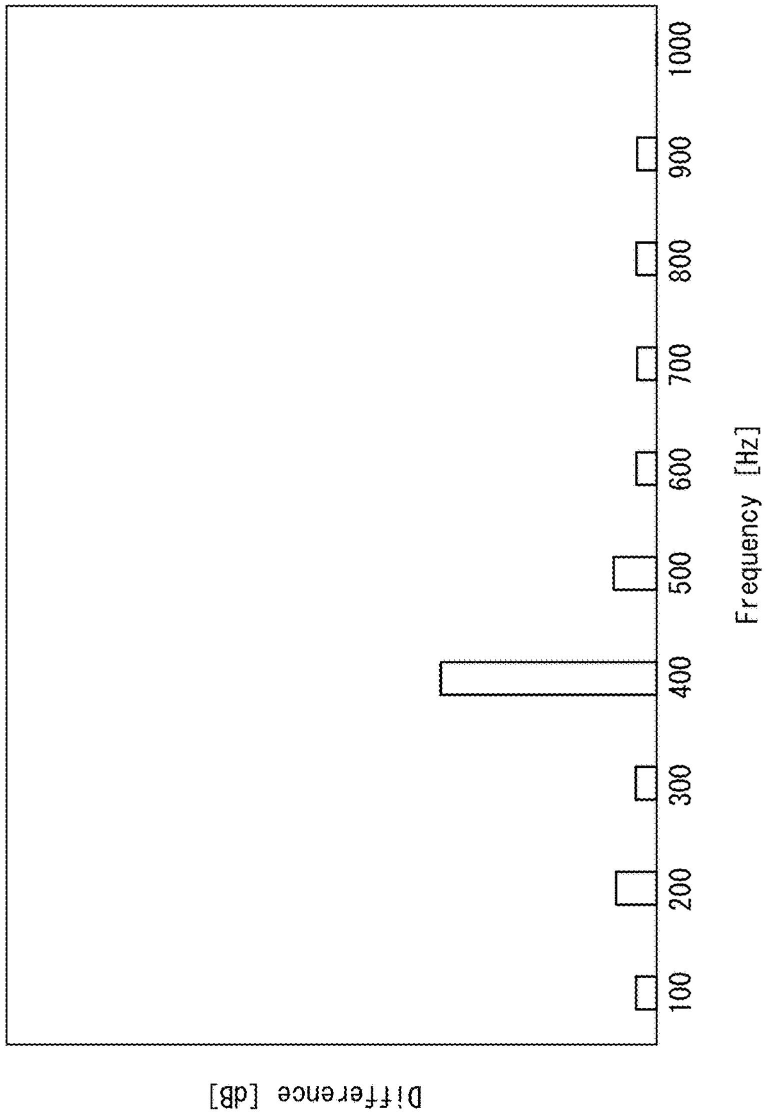
FIG. 9 is a graph illustrating an example of a difference spectrum between the frequency spectrum of excitation vibration and the frequency spectrum of excitation noise of the stacked iron core in the transformer.

Next, in step S6 (fourth step), the controller 42 calculates the difference between the frequency spectrum of the excitation noise of the stacked iron core 21 in the transformer acquired in the first step (step S1) and the frequency spectrum of the excitation vibration of the stacked iron core 21 in the transformer calculated in the second step (steps S2 to S5). FIG. 9 is a graph illustrating an example of the calculated frequency spectrum of the difference between the excitation noise spectrum (measured value) and the frequency spectrum (calculated value) of the excitation vibration of the stacked iron core 21 in the transformer.

Next, in step S7 (fifth step), the controller 42 diagnoses the noise performance of the transformer based on the difference spectrum calculated in the fourth step (step S6). The frequency spectrum (calculated value) of the excitation vibration of the stacked iron core 21 in the transformer illustrated in FIG. 8 as an example represents the predicted value of the excitation vibration noise emitted only by the iron core made up of the electrical steel sheets. The frequency spectrum (measured value) of the excitation noise of the stacked iron core 21 in the transformer illustrated in FIG. 4 as an example, on the other hand, represents the excitation vibration noise of the entire transformer, including not only the iron core made up of the electrical steel sheets but also the accessory parts other than the electrical steel sheets, such as metal fittings for fixing the iron core. In view of the meanings of these frequency spectra, the difference spectrum between the excitation noise spectrum (measured value) and the frequency spectrum of the excitation vibration (calculated value) of the stacked iron core 21 in the transformer illustrated in FIG. 9 as an example can be interpreted as corresponding to the increase in transformer noise due to the noise emitted by the accessory parts other than the electrical steel sheets of the target transformer as a noise source. Through such interpretation of the physical meaning of the difference spectrum between the excitation noise spectrum (measured value) and the frequency spectrum of the excitation vibration (calculated value) of the stacked iron core 21 in the transformer illustrated in FIG. 9 as an example, the controller 42 can easily identify the frequency of noise generated in the accessory parts other than the electrical steel sheets of the transformer.

For example, the component at a frequency of 400 Hz is large in the difference spectrum illustrated in FIG. 9. Based on this, the controller 42 can easily diagnose that the noise of the entire transformer increases as a result of any of the accessory parts of the transformer vibrating at 400 Hz. Each component of the difference spectrum is also referred to as "difference value". The frequency at which the difference value is maximum is also referred to as "peak frequency". The controller 42 may determine the frequency at which the difference value is maximum as the peak frequency based on the difference spectrum.

The controller 42 acquires the measurement results of the vibration frequencies of the accessory parts. The vibration frequency of each accessory part can be measured by attaching an acceleration sensor to the accessory part and exciting it, or by measuring the vibration frequency of the accessory part with a laser Doppler vibrometer in a state in which the transformer is excited.

The controller 42 may extract any accessory part whose vibration frequency corresponds to a frequency with a large value in the difference spectrum, and generate and notify a diagnosis result urging to take noise reduction measures for the extracted part. The controller 42 may extract any part whose vibration frequency is the same value as the peak frequency of the difference spectrum or any part whose vibration frequency has a difference of not more than a predetermined value from the peak frequency, and generate and notify a diagnosis result urging to take noise reduction measures for the extracted part. The part extracted based on the difference spectrum can be regarded as being identified as a part that causes an increase in transformer noise. For example, in the case where the difference spectrum is calculated as illustrated in the graph of FIG. 9, any part whose vibration frequency is 400 Hz may be extracted from among the accessory parts and subjected to noise reduction measures. In this way, the transformer noise can be reduced efficiently or at low cost.

EXAMPLES

The following will describe verification of the effects of implementing the transformer noise performance diagnosis method and noise reduction method according to this embodiment by way of an example.

First, grain-oriented electrical steel sheets 22 of 0.23 mm in thickness were prepared. The prepared grain-oriented electrical steel sheets 22 were then stacked together to produce a stacked iron core 21 for a three-phase tripod transformer subjected to vibration analysis as illustrated in FIG. 1. The thickness of the stacked steel sheets of the stacked iron core 21 was 100 mm. The dimensions of each of the upper yoke 22*a* and the lower yoke 22*b* were 100 mm in width and 500 mm in length. The dimensions of each of the three legs 22*c* were 100 mm in width with an iron core window length of 300 mm. The legs 22*c* were connected between the upper yoke 22*a* and the lower yoke 22*b* with spacing of 100 mm from each other. An IV electric wire was wound around each of the three legs 22*c* of the produced stacked iron core 21 to form an excitation coil.

A 50 Hz three-phase current was applied to the coil, and the power supply voltage was adjusted so that the iron core magnetic flux density would be exactly 1.7 T. In this state, the excitation noise was measured using a noise meter to obtain the frequency spectrum of the noise as in step S1 in FIG. 3. Suppose the measurement result of the frequency spectrum of the noise in this example was the same as that illustrated in the graph of FIG. 4. Of the components of the frequency spectrum of the noise measured in this example, the magnitude of the component at a frequency of 100 Hz was approximately 23 dBA.

Next, the excitation magnetostriction of the prepared grain-oriented electrical steel sheets 22 when excited at an excitation frequency of 50 Hz and a magnetic flux density of 1.7 T was measured using a magnetostriction measurement device to obtain the frequency spectrum of the magnetostriction. Suppose the frequency spectrum of the magnetostriction in this example was the same as that illustrated in the graph of FIG. 6. Of the components of the frequency spectrum of the magnetostriction in this example, the magnitude of the component at a frequency of 100 Hz was approximately 1.5E-7.

Vibration response analysis was then performed on the stacked iron core 21 in the transformer subjected to vibration analysis using structural analysis software. Here, seven out of the total of nine mechanical property values of the stacked iron core 21, i.e. the longitudinal elasticity moduli Ex, Ey, and Ez, the transverse elasticity moduli Gyz, Gzx, and Gxy, and the Poisson's ratios νxy, νyz, and νzx, were set as follows:

$$Ex = 132\ GPa,\ Ey = 220\ GPa,\ Ez = 10\ GPa$$

$$Gxy = 116\ GPa$$

$$vxy = 0.37,\ vyz = vzx = 0,$$

where x corresponds to the steel sheet rolling direction, y corresponds to a direction orthogonal to x, and z corresponds to the steel sheet stacking direction.

The remaining two transverse elasticity moduli Gyz and Gzx in the two planes each including the stacking direction were determined using the technique disclosed in JP 6729837 B1 as mentioned above.

The clamping pressure in the stacking direction of the iron core when producing the stacked iron core 21 for a three-phase tripod transformer illustrated in FIG. 1 was 0.1 MPa. Accordingly, the transverse elasticity moduli of the stacked iron core 21 were determined to be Gyz=Gzx=0.09 GPa. Suppose the frequency spectrum of the vibration response function of the stacked iron core 21 calculated in this example was the same as that illustrated in the graph of FIG. 7. Of the components of the frequency spectrum of the vibration response function calculated in this example, the magnitude of the component at a frequency of 1000 Hz was approximately 13 dB.

Following this, the frequency spectrum of the excitation vibration of the stacked iron core 21 in the transformer was calculated based on the frequency spectrum data of the excitation magnetostriction of the electrical steel sheets and the frequency spectrum of the vibration response function of the stacked iron core 21 in the transformer. Suppose the frequency spectrum of the excitation vibration of the stacked iron core 21 calculated in this example was the same as that illustrated in the graph of FIG. 8. Of the components of the frequency spectrum of the excitation vibration calculated in this example, the magnitude of the component at a frequency of 100 Hz was approximately 22 dBA.

The difference spectrum between the frequency spectrum of the excitation noise of the stacked iron core 21 in the transformer illustrated in FIG. 4 and the frequency spectrum of the excitation vibration of the stacked iron core 21 in the transformer illustrated in FIG. 8 was then calculated. Suppose the difference spectrum calculated in this example was the same as that illustrated in the graph of FIG. 9. Of the components of the difference spectrum calculated in this example, the magnitude of the component at a frequency of 400 Hz was approximately 10 dB.

After this, the noise performance of the transformer was diagnosed based on the difference spectrum illustrated in FIG. 9. In this example, it was diagnosed that there was a part vibrating at 400 Hz among the accessory parts of the transformer to be diagnosed and the noise generated by the vibration of that part caused an increase in transformer noise.

Hence, the vibration frequency of each accessory part of the transformer to be diagnosed was measured using a laser vibrometer while exciting the transformer at a frequency of 50 Hz and a magnetic flux density of 1.7 T. As a result, it was found that the end of the metal fitting clamping the upper yoke 22*a* of the stacked iron core 21 in the transformer was vibrating at 400 Hz.

In view of this, one bolt was added to the end of the metal fitting clamping the upper yoke 22*a* of the stacked iron core 21 in the transformer to increase the tightening force and enhance the rigidity of the metal fitting. This resulted in 3.5 dB reduction of the excitation noise of the transformer in overall value.

As described above, in this example, it was possible to identify the accessory part causing the increase in transformer noise and easily take noise reduction measures for the identified part.

Although the embodiment of the present disclosure has been described by way of the drawings and examples, various changes and modifications may be made by those of ordinary skill in the art based on the present disclosure. Such various changes and modifications are therefore included in the scope of the present disclosure. For example, the functions included in the components, steps, etc. may be rearranged without logical inconsistency, and a plurality of components, steps, etc. may be combined into one component, step, etc. and a component, step, etc. may be divided into a plurality of components, steps, etc. The embodiment of the present disclosure may also be implemented as a program executed by a processor included in the device or a storage medium storing the program. These are also encompassed within the scope of the present disclosure.

Although the foregoing embodiment describes noise performance diagnosis for three-phase tripod transformers, the present disclosure is not limited to such and is also applicable to noise performance diagnosis for stacked iron cores 21 in three-phase pentapod transformers or other transformers.

REFERENCE SIGNS LIST

21 stacked iron core
22 grain-oriented electrical steel sheet (22*a*: upper yoke, 22*b*: lower yoke, 22*c*: leg)
40 noise performance diagnosis device (42: controller, 44: storage, 46: interface)

The invention claimed is:

1. A transformer noise performance diagnosis method comprising:

a first step of measuring, by a noise measurement device, an excitation noise of a stacked iron core included in a transformer and acquiring a frequency spectrum of the excitation noise, the stacked iron core being formed by stacking electrical steel sheets;

a second step of, by a calculation processing device installed in a noise performance diagnosis device, for excitation vibration calculation for the stacked iron core in the transformer using a constitutive equation that includes an elasticity matrix representing a relationship between stress and strain in the stacked iron core in matrix representation, determining transverse elasticity moduli in two planes each including a stacking direction of the stacked iron core in the transformer, the transverse elasticity moduli being included as elements in the elasticity matrix;

a third step of performing, by the calculation processing device, the excitation vibration calculation for the stacked iron core in the transformer using the constitutive equation that includes the elasticity matrix including, as the elements, the transverse elasticity moduli determined in the second step and acquiring a frequency spectrum of an excitation vibration of the stacked iron core in the transformer;

a fourth step of calculating, by the calculation processing device, a difference between the frequency spectrum of the excitation noise of the stacked iron core in the transformer acquired in the first step and the frequency spectrum of the excitation vibration of the stacked iron core in the transformer acquired in the third step, as a difference spectrum; and a fifth step of diagnosing, by the noise performance diagnosis device, noise performance of the transformer based on the difference spectrum calculated in the fourth step.

2. The transformer noise performance diagnosis method according to claim 1, wherein in the fifth step, a frequency at which a difference value of the difference spectrum is maximum is determined, by the noise performance diagnosis device, as a peak frequency.

3. A transformer noise reduction method comprising a step of, based on a result of diagnosis of the noise performance of the transformer obtained by the transformer noise performance diagnosis method according to claim 1, identifying, by the noise performance diagnosis device, a part that causes an increase in the noise of the transformer, and generating and notifying, by the noise performance diagnosis device, a diagnosis result urging to take a noise reduction measure for the identified part.

4. The transformer noise reduction method according to claim 3, further comprising a step of identifying, by the noise performance diagnosis device, from among parts other than the stacked iron core in the transformer, a part whose vibration frequency when the transformer is excited is a same value as a peak frequency at which a difference value of the difference spectrum is maximum or a part whose vibration frequency when the transformer is excited has a difference of not more than a predetermined value from the peak frequency, as the part that causes the increase in the noise of the transformer.

5. A transformer noise reduction method comprising a step of, based on a result of diagnosis of the noise performance of the transformer obtained by the transformer noise performance diagnosis method according to claim 2, identifying, by the noise performance diagnosis device, a part that causes an increase in the noise of the transformer, and generating and notifying a diagnosis result urging to take a noise reduction measure for the identified part.

6. The transformer noise reduction method according to claim 5, further comprising a step of identifying, by the noise performance diagnosis device, from among parts other than the stacked iron core in the transformer, a part whose vibration frequency when the transformer is excited is a same value as a peak frequency at which a difference value of the difference spectrum is maximum or a part whose vibration frequency when the transformer is excited has a difference of not more than a predetermined value from the peak frequency, as the part that causes the increase in the noise of the transformer.

7. A transformer noise performance diagnosis device comprising a controller configured to:

acquire a frequency spectrum of an excitation noise of a stacked iron core included in a transformer, the stacked iron core being formed by stacking electrical steel sheets;

determine, for excitation vibration calculation for the stacked iron core in the transformer using a constitutive equation that includes an elasticity matrix representing a relationship between stress and strain in the stacked iron core in matrix representation, transverse elasticity moduli in two planes each including a stacking direction of the stacked iron core in the transformer, the transverse elasticity moduli being included as elements in the elasticity matrix;

perform the excitation vibration calculation for the stacked iron core in the transformer using the constitutive equation that includes the elasticity matrix including, as the elements, the determined transverse elasticity moduli and acquire a frequency spectrum of an excitation vibration of the stacked iron core in the transformer;

calculate a difference between the frequency spectrum of the excitation noise of the stacked iron core in the transformer and the frequency spectrum of the excitation vibration of the stacked iron core in the transformer, as a difference spectrum; and diagnose noise performance of the transformer based on the calculated difference spectrum.

8. The transformer noise performance diagnosis device according to claim 7, wherein the controller is further configured to:

determine a frequency at which a difference value of the difference spectrum is maximum as a peak frequency; and identify a part that causes an increase in the noise of the transformer based on the peak frequency.

9. The transformer noise performance diagnosis device according to claim 8, wherein the controller is further configured to:

identify, from among parts other than the stacked iron core in the transformer, a part whose vibration frequency when the transformer is excited is a same value as the peak frequency or a part whose vibration frequency when the transformer is excited has a difference of not more than a predetermined value from the peak frequency, as the part that causes the increase in the noise of the transformer.

* * * * *